(12) United States Patent
Cook et al.

(10) Patent No.: US 7,488,664 B2
(45) Date of Patent: Feb. 10, 2009

(54) CAPACITOR STRUCTURE FOR TWO-TRANSISTOR DRAM MEMORY CELL AND METHOD OF FORMING SAME

(75) Inventors: Keith Cook, Boise, ID (US); Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 11/200,667

(22) Filed: Aug. 10, 2005

(65) Prior Publication Data
US 2007/0034928 A1   Feb. 15, 2007

(51) Int. Cl.
*H01L 21/20* (2006.01)

(52) U.S. Cl. .................... 438/386; 257/532; 257/71

(58) Field of Classification Search ............. 257/66, 257/68–71, 296–313, 905–908; 438/255, 438/398, 386
See application file for complete search history.

(56) References Cited

U.S. PATENT DOCUMENTS

| | | | | |
|---|---|---|---|---|
| 4,388,121 A | * | 6/1983 | Rao | 438/250 |
| 4,835,589 A | * | 5/1989 | Pfiester | 257/304 |
| 4,890,144 A | * | 12/1989 | Teng et al. | 257/66 |
| 5,122,986 A | | 6/1992 | Lim | 365/189 |
| 5,389,568 A | * | 2/1995 | Yun | 438/396 |
| 5,597,756 A | * | 1/1997 | Fazan et al. | 438/398 |
| 6,215,187 B1 | * | 4/2001 | Ooto et al. | 257/758 |
| 6,438,016 B1 | | 8/2002 | Keeth et al. | 365/63 |
| 6,444,538 B2 | * | 9/2002 | Kwon et al. | 438/396 |
| 6,455,369 B1 | * | 9/2002 | Forster et al. | 438/249 |
| 6,759,704 B2 | * | 7/2004 | Park | 257/306 |
| 6,809,363 B2 | * | 10/2004 | Yu et al. | 257/296 |
| 7,034,353 B2 | * | 4/2006 | Thakur et al. | 257/309 |
| 2001/0006837 A1 | * | 7/2001 | Kwon et al. | 438/396 |
| 2004/0007725 A1 | * | 1/2004 | Son | 257/296 |
| 2006/0054983 A1 | * | 3/2006 | Acar et al. | 257/415 |

* cited by examiner

*Primary Examiner*—N Drew Richards
*Assistant Examiner*—Swapneel Chhaya (57) ABSTRACT

A capacitor structure for a semiconductor assembly and a method for forming same are described. The capacitor structure comprises a pair of electrically separated capacitor electrodes and a capacitor electrode being common to only the pair of electrically separated capacitor electrodes.

9 Claims, 10 Drawing Sheets

CAPACITOR STRUCTURE FOR TWO-TRANSISTOR DRAM MEMORY CELL AND METHOD OF FORMING SAME

FIELD OF THE INVENTION

This invention relates to a semiconductor structure and a semiconductor fabrication method to from the semiconductor structure and, more particularly, to a capacitor structure for a two-transistor dynamic random access memory (DRAM) cell and method for forming same.

BACKGROUND OF THE INVENTION

The continuing trend of scaling down integrated circuits has motivated the semiconductor industry to consider new techniques for fabricating precise components at sub-micron levels. In dynamic random access memory (DRAM) devices it is essential that storage node capacitor cell plates be large enough to exhibit sufficient capacitance in order to retain an adequate charge in spite of parasitic capacitance and noise that may be present during circuit operation. As is the case for most semiconductor integrated circuitry, circuit density is continuing to increase at a fairly constant rate.

The issue of maintaining storage node capacitance is particularly important as the density of DRAM arrays continues to increase for future generations of memory devices. The ability to densely pack memory cells while maintaining required capacitance levels is a crucial requirement of semiconductor manufacturing technologies if future generations of expanded memory array devices are to be successfully manufactured.

One area of DRAM technology is the development of a two-transistor memory cell such as taught in U.S. Pat. No. 5,122,986, by Lim or in U.S. Pat. No. 6,438,016 B1, by Keeth et al., both of which are incorporated by reference, as if set forth in their entirety. U.S. Pat. No. 5,122,986 shows the utilization of a data read transistor and a data write transistor that are coupled such that a storage node is developed by a parasitic capacitance between the source/drain electrode of the write transistor and the control gate of the read transistor. U.S. Pat. No. 6,438,016 B1 shows the utilization of a storage cell comprising a storage capacitor coupled to the drain of a (data) read/write transistor and to the drain of a (data) refresh transistor.

U.S. Pat. Nos. 5,122,986 and 6,438,016 B1 utilize a two-transistor memory cell, where U.S. Pat. No. 5,122,986 develops a storage node using parasitic capacitance between the two-transistors of the memory cell, while U.S. Pat. No. 6,438,016 B1 develops an actual storage capacitor between the two-transistor memory cell.

Utilizing a two-transistor memory cell in a DRAM device requires that the memory cell structure be scaled to meet the density requirements of current and future die size, while maintaining sufficient charge storage capability of the storage capacitance.

The present invention describes a capacitor structure and a method to form the capacitor structure that addresses the above challenges.

SUMMARY OF THE INVENTION

Exemplary implementations of the present invention include a memory cell structure and a method of forming thereof for semiconductor devices or assemblies. The capacitor structure comprises a pair of electrically separated capacitor electrodes and a capacitor electrode being common to only the pair of electrically separated capacitor electrodes.

DETAILED DESCRIPTION OF THE INVENTION

Exemplary implementations of the present invention are directed to a structure comprising a pair of storage capacitors having a common top cell plate and a process for forming same, as depicted in FIGS. 1-10.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
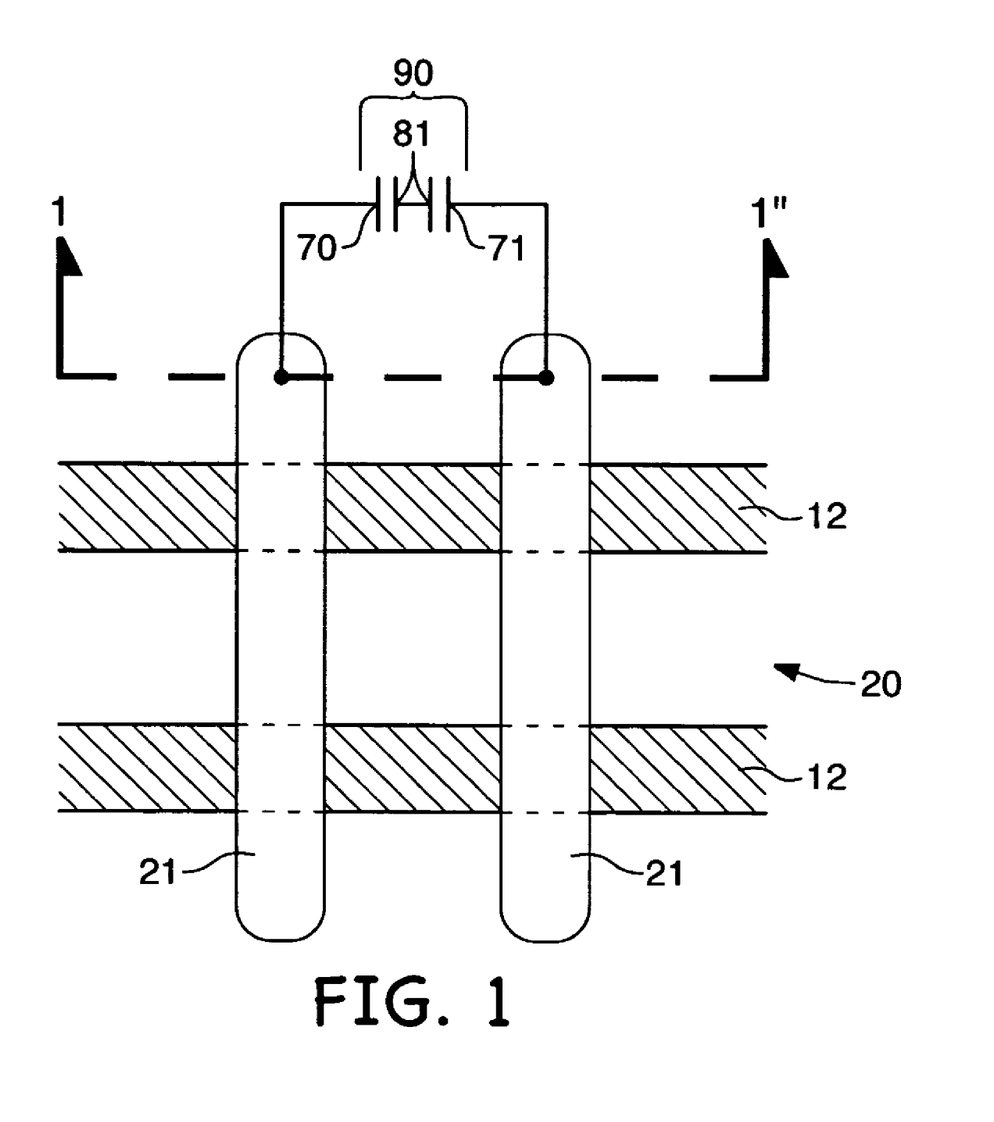
FIG. 1 is an overhead layout view of a DRAM memory array segment depicting a two-transistor DRAM cell including a schematically representation of a pair of storage capacitors having a common top cell plate depicting an embodiment of the present invention.

FIG. 1 is an overhead layout view of a DRAM memory array segment 20 (or substrate section 20) depicting a two-transistor DRAM cell including a schematically representation of a pair of storage capacitors 13, each having individual storage node plates 70 and 71 and a common top cell plate 81, the combination of which depicts a preferred embodiment of the present invention. Fabrication steps to form the pair of storage capacitors having a common top cell plate structure of FIG. 1 are described in FIGS. 2-9.

Figure 2:
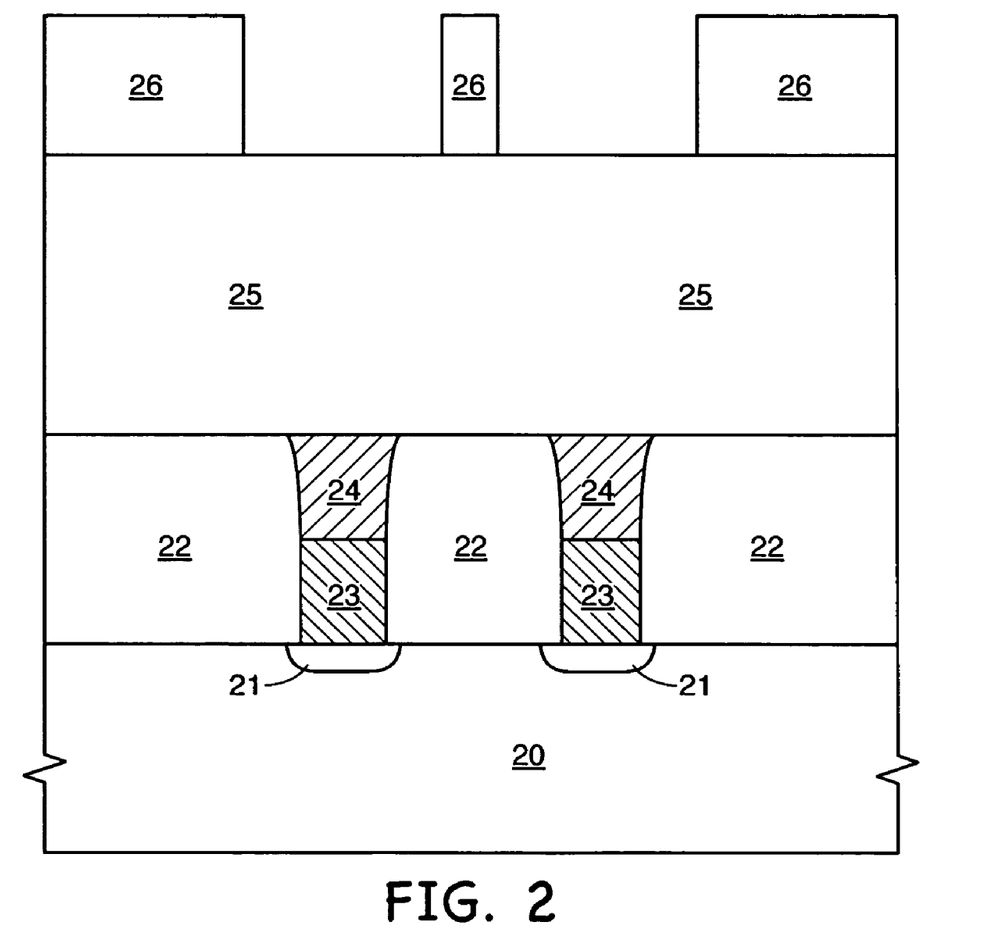
FIG. 2 is a cross-sectional view taken through line 1-1' of FIG. 1 depicting a semiconductor substrate section having a patterned photoresist overlying an insulator that covers conductive plugs connecting to underlying active areas (i.e., source/drain regions of an access transistor).

FIG. 2 is a cross-sectional view taken through line 1-1' of FIG. 1 depicting a semiconductor substrate section 20 having a patterned photoresist 26 overlying an planarized insulation material 25, such as borophosphosilicate glass (BPSG), that covers combination of conductive plugs 23 and 24 connecting to underlying active areas 21 (i.e., source/drain regions of an access transistor). The combination of conductive plugs 23 and 24, such as conductively doped polysilicon plugs, are separated by isolation material 22, such as BPSG. The active areas 21, formed in substrate section 20, are part of field effect transistors (FETs) previously formed by conventional fabrication steps known to those skilled in the art, but are not seen in this cross-section. Patterned photoresist 26 is patterned to align with the underlying conductive plugs 24.

Figure 3:
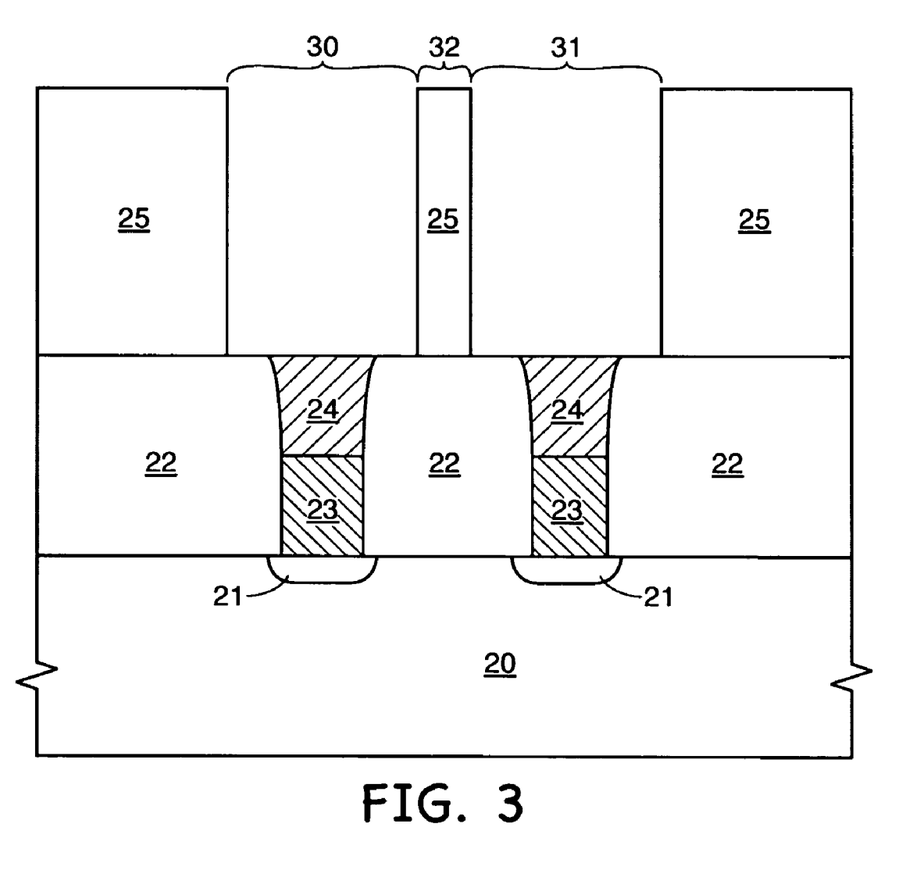
FIG. 3 is a cross-sectional view taken from FIG. 2 following an etching of a pair of openings, having a common center post, into the insulating material to provide access to the underlying polysilicon plugs.

Referring now to FIG. 3, using photoresist 26 (seen in FIG. 2) as a pattern, an etch is performed to remove exposed insulation material 25 to expose the surface of underlying conductive plugs 24, thus forming openings 30 and 31, separated by adjoining pillar 32 of insulation material 25. Openings 30 and 31 will serve as the area in which a pair of storage node capacitor electrodes will be subsequently formed.

Figure 4:
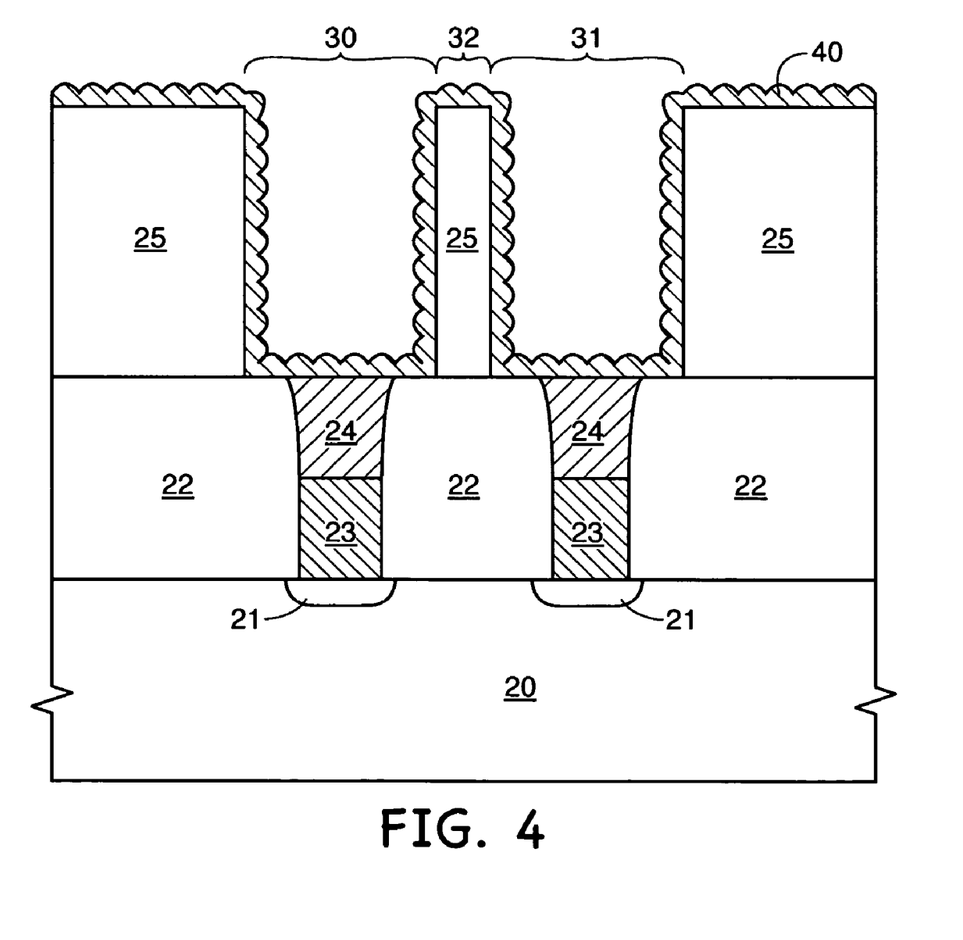
FIG. 4 is a cross-sectional view taken from FIG. 3 following the formation of a hemi-spherical grain (HSG) silicon on the surface of the insulating material, including along the sidewalls of the openings and onto the surface of the exposed polysilicon plugs.

Referring now to FIG. 4, a layer of conductively doped, hemispherical grained (HSG) silicon 40 is formed on the existing surface of the semiconductor assembly. As seen in FIG. 4, the HSG silicon forms on the horizontal and vertical surfaces of isolation material 25 and on the exposed horizontal surface of conductive plugs 24. The HSG silicon can be formed by conventional process steps know to those skilled in the art. For example, one method comprises forming a conformal layer of amorphous silicon on the exposed surfaces of insulation material 25, into openings 30 along the sidewalls of insulation material 25, and the exposed surface of poly plugs 24. The amorphous silicon layer may be formed by decomposing $SiH_4$ at approximately 500° C. and may be a conductively doped material, a non-conductively doped material, or a combination of doped and non-conductively doped amorphous silicon layers and will serve as a silicon-seeding site for a subsequent formation of the HSG silicon. The HSG silicon is then formed on the amorphous silicon layer by methods known to those skilled in the art. Typically, the formation of HSG silicon does not result in uniform silicon spheres and may instead be non-uniform silicon hemispheres with varying grain size and grain spacing.

Figure 5:
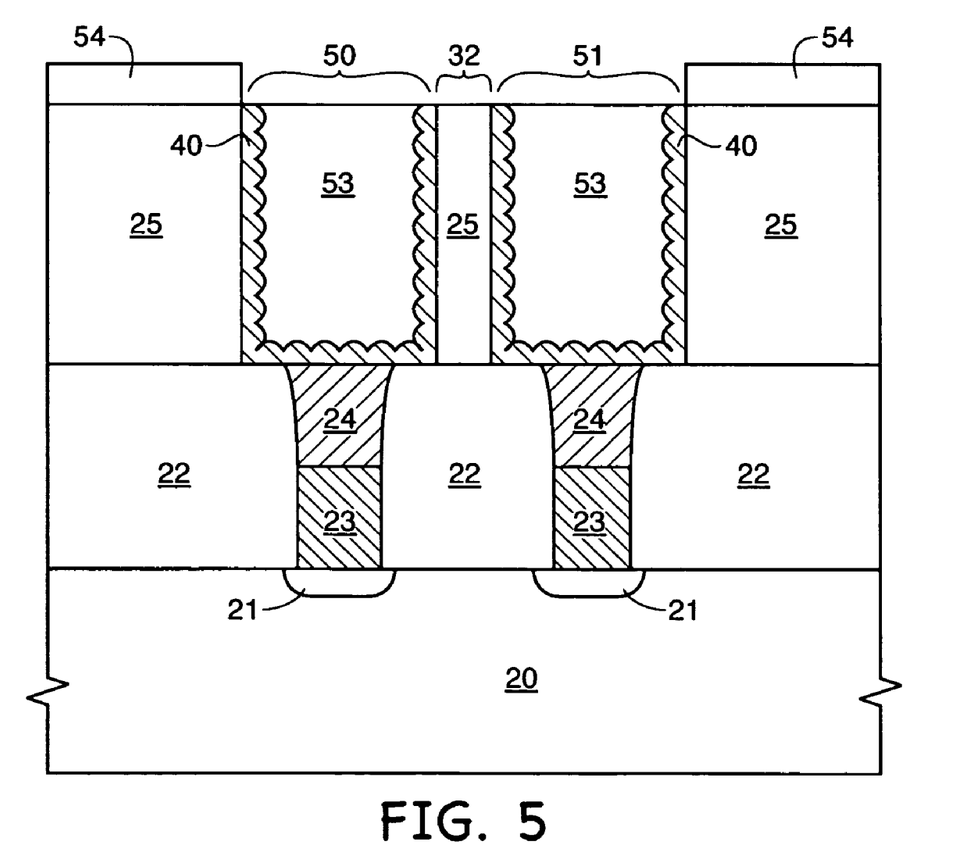
FIG. 5 is a cross-sectional view taken from FIG. 4 following a planarization of the HSG silicon, filling the openings with a resist material, and then the formation of a patterned etch stop layer.

Referring now to FIG. 5, the HSG silicon 40 is planarized so that the portions of the HGS silicon that reside on the upper horizontal surface of insulation material 25 are completely removed. The result of this planarization step forms containers 51 and 51 that are lined with HSG silicon 40. A resist material 50 is used to completely fill containers 50 and 51 and then an etch stop layer 54 is patterned and etched to have the containers 50 and 51 exposed, along with the adjoining pillar 32 of insulation material 25. Etch stop layer 54 is in place to protect underlying insulation material 25 from a subsequent etch.

Figure 6:
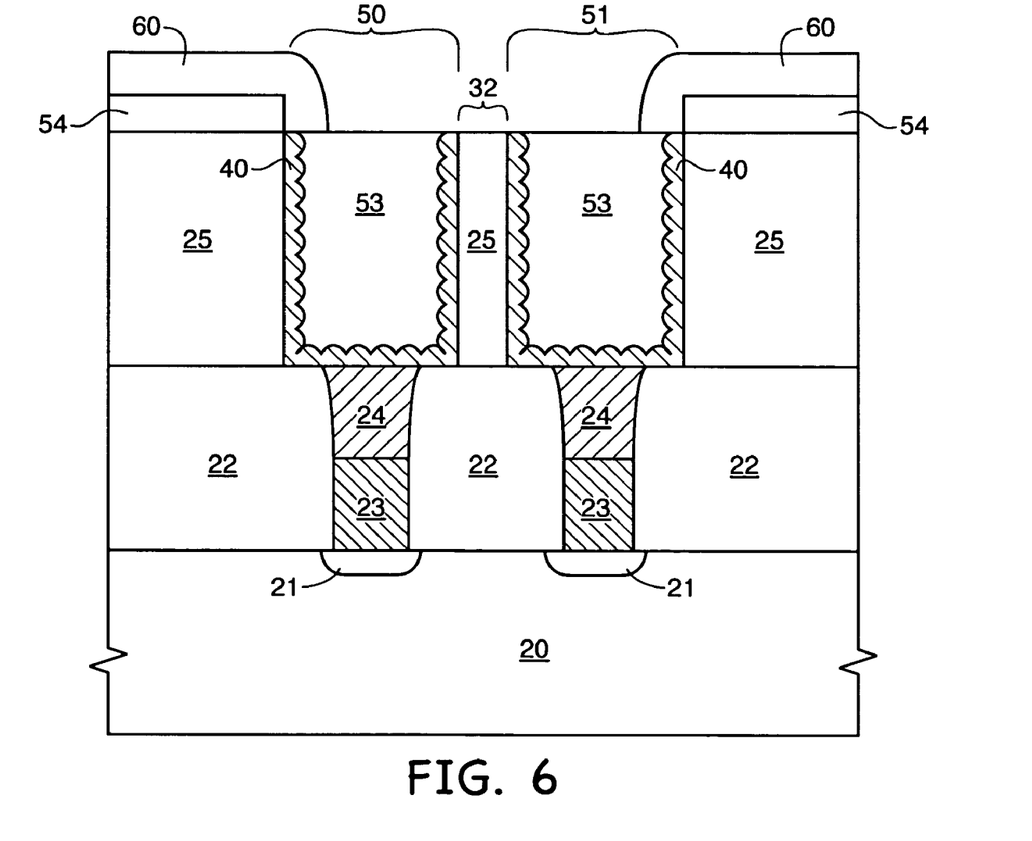
FIG. 6 is a cross-sectional view taken from FIG. 5 following the and the formation and patterning of a second photoresist layer that exposes the common center post between the pair of openings.

Referring now to FIG. 6, photoresist 60 is patterned to cover etch stop layer 54 and expose major portions of containers 50 and 51, as well as adjoining pillar 32.

Figure 7:
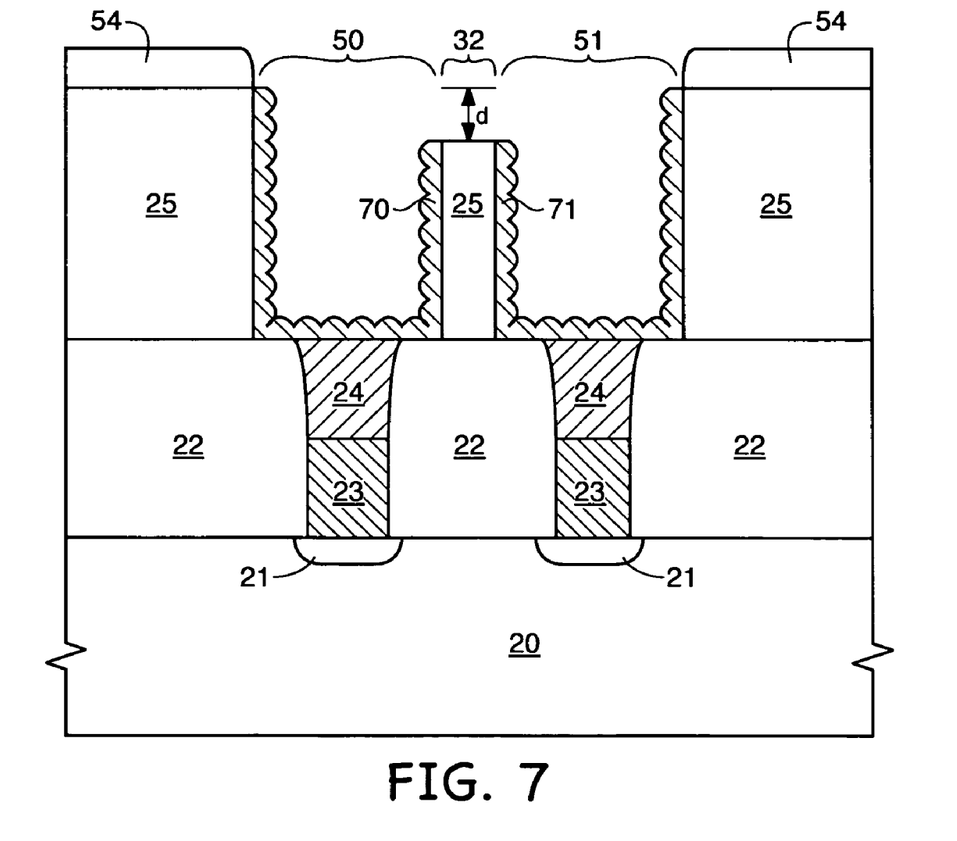
FIG. 7 is a cross-sectional view taken from FIG. 6 following the height reduction of the common center post, the removal of the resist.

Referring now to FIG. 7, an etch is performed to reduce the height of pillar 32, along with the HSG silicon that adheres to the sidewalls of pillar 32, by the amount "d". This etch is to insure that the HSG silicon on the sidewalls of pillar 32 is completely severed so that individual capacitor storage node electrodes 70 and 71, comprising HSG silicon, are formed. The remaining resist 53 is then completely removed from containers 50 and 51.

Figure 8:
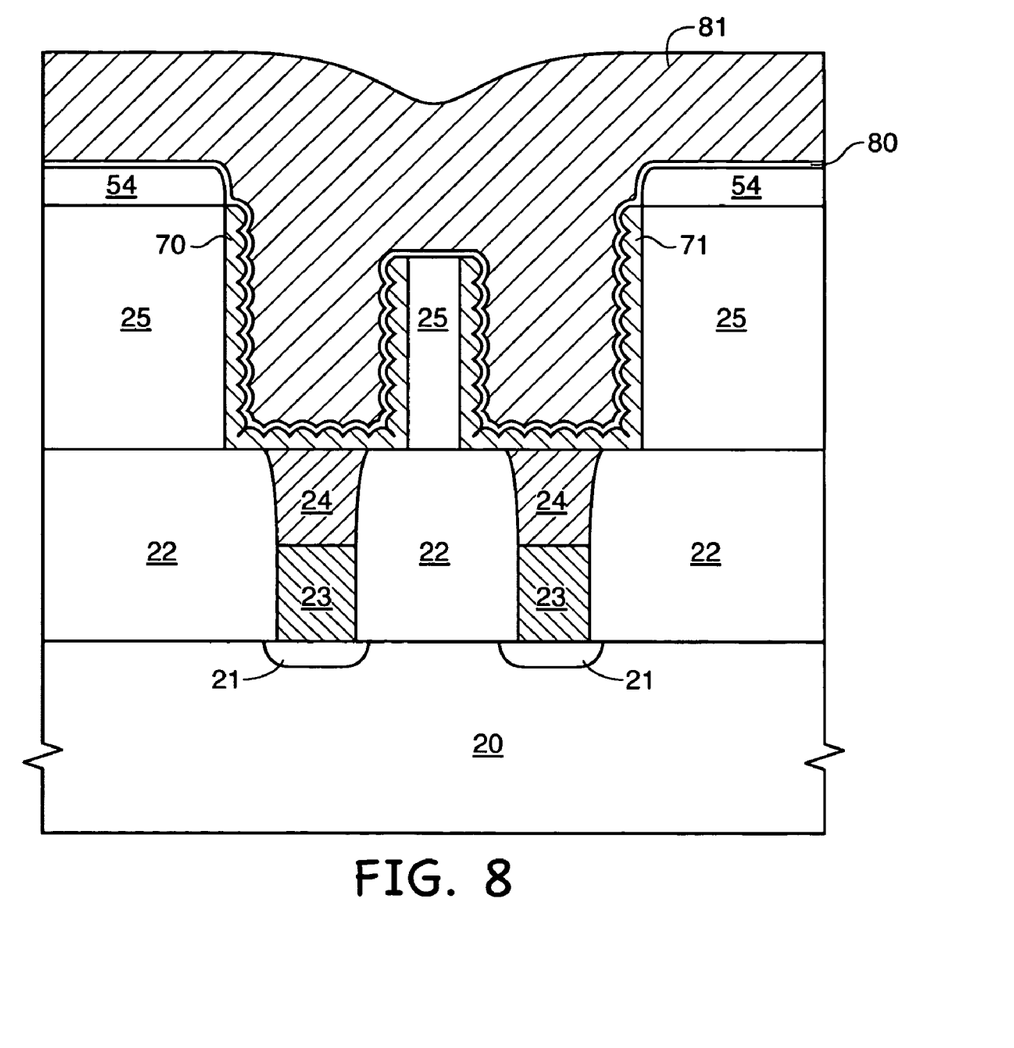
FIG. 8 is a cross-sectional view taken from FIG. 7 following the formation of a conformal storage cell dielectric layer and the formation of a common cell electrode material.

Referring now to FIG. 8, a conformal storage cell dielectric 80, such as nitride, is formed over, preferably directly on the HSG silicon storage node electrodes 70 and 71 and the exposed regions of bordering isolation material 25 including the top surface of insulation pillar 32. Next, a conductive material 81 is formed to substantially fill containers 50 and 51, along with covering the dielectric material that covers etch stop layer 54.

Figure 9:
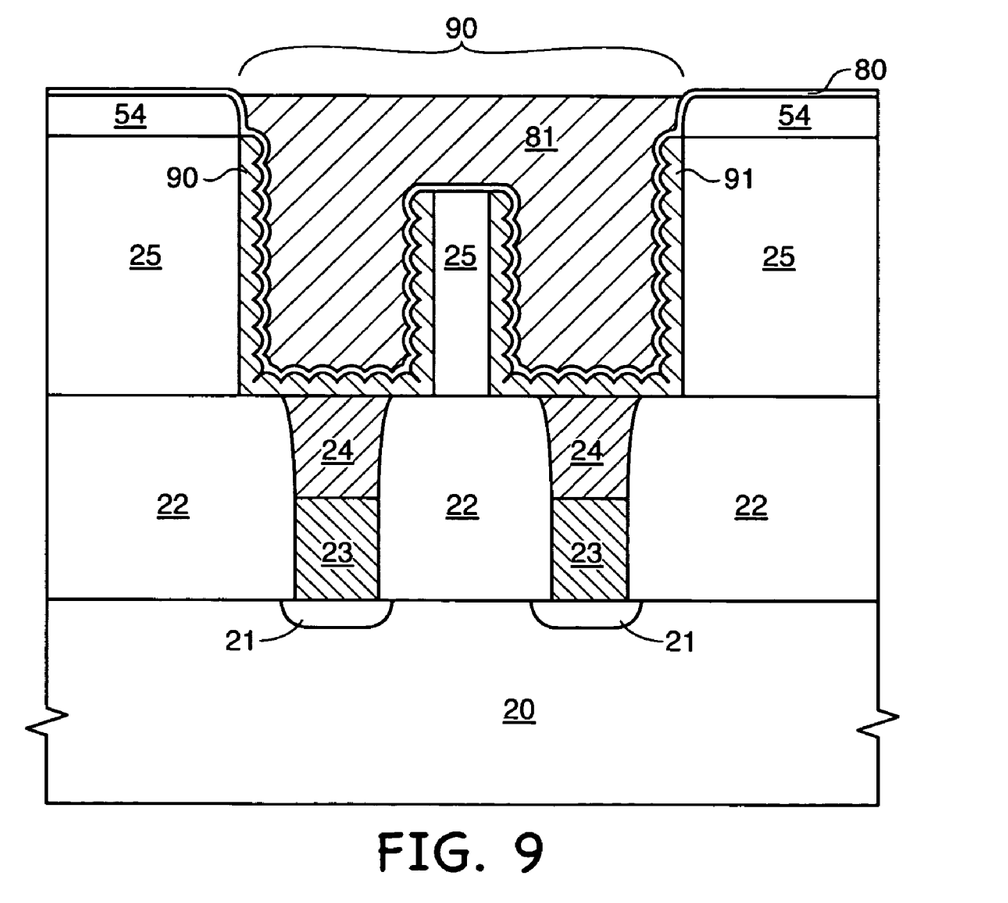
FIG. 9 is a cross-sectional view taken from FIG. 8 following the planarization of the common cell electrode material to form a common cell plate tow a pair of container capacitor cells.

Referring now to FIG. 9, the conductive material 81 is planarized to form a capacitor top cell electrode 81 that is common to the pair of storage node electrodes 70 and 71. The combination of storage node electrodes 70 and 71 and common top cell electrode 81 form the capacitor structure 90 of the present invention such that the top cell plate is common to only a single pair of storage node electrodes throughout the memory array structure. This arrangement is conducive to a two-transistor dynamic random access transistor memory cell, such as those depicted in U.S. Pat. Nos. 5,122,986 and 6,438,016 B1. U.S. Pat. Nos. 5,122,986 and 6,438,016 B1 are herby incorporated by reference as if set forth in their entirety.

Figure 10:
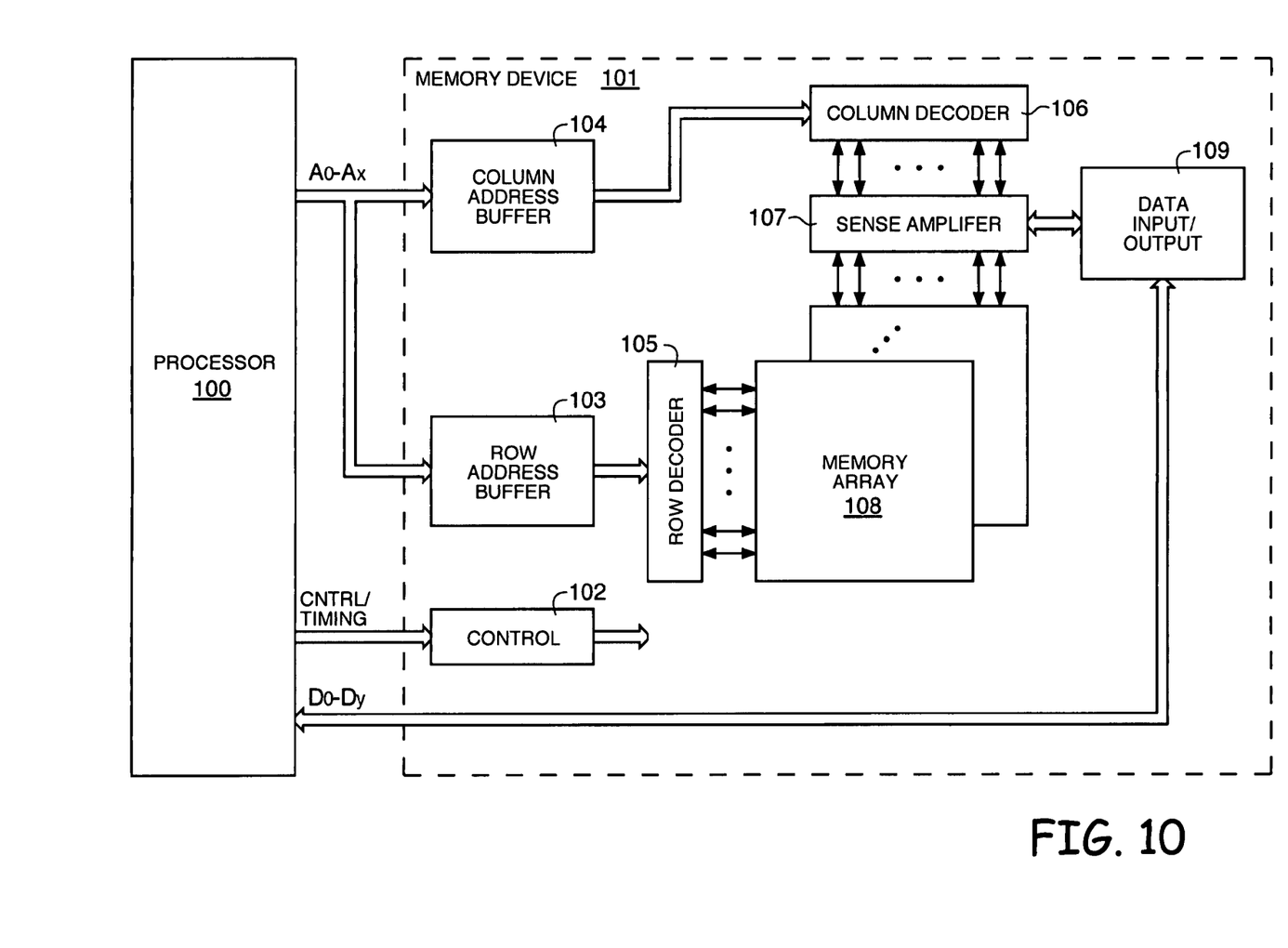
FIG. 10 is a simplified block diagram of a semiconductor system comprising a processor and memory device to which the present invention may be applied.

The present invention may be applied to a semiconductor system, such as the one depicted in FIG. 10, the general operation of which is known to one skilled in the art. FIG. 10 represents a general block diagram of a semiconductor system comprising a processor 100 and a memory device 101 showing the basic sections of a memory integrated circuit, such as row and column address buffers, 103 and 104, row and column decoders, 105 and 106, sense amplifiers 107, memory array 108 and data input/output 109, which are manipulated by control/timing signals from the processor through control 102.

It is to be understood that although the present invention has been described with reference to several preferred embodiments, various modifications, known to those skilled in the art, such as utilizing the disclosed methods to form DRAM storage capacitors or other semiconductor devices, may be made to the process steps presented herein without departing from the invention as recited in the several claims appended hereto.

What is claimed is:

1. A method for forming a capacitor structure in a semiconductor device, the method comprising:

forming a first patterned photoresist over an insulation material such that openings in the first photoresist align to a pair of underlying conductors;

etching into the insulation material to form a pair of openings therein, separated by a pillar of insulation, while exposing the pair of underlying conductors;

forming a conductive material on the surface of the insulation material, along sidewalls of the pair of openings, and on the surface of the pillar, the conductive material leaving a cavity in each opening;

removing the conductive material from the surface of the insulation material and top of the pillar:

forming an etch stop that covers the insulation material but exposes the pair of openings and the pillar;

filling the cavity in each opening with resist material;

forming a second patterned photoresist that covers the etch stop and exposes a majority of each cavity and the pillar;

removing the resist material residing in each of the cavities so as to expose the conductive material residing therein;

reducing the height of the pillar to be lower than the surface of the insulation material;

forming a capacitor dielectric lining the pair of electrically separated capacitor electrodes; and forming a capacitor electrode laying on the capacitor dielectric lining, the capacitor electrode being common to only the pair of electrically separated capacitor electrodes.

2. A method of manufacturing a capacitor structure, the method comprising:
- forming a pair of openings in an insulation material such that each opening exposes an underlying conductor, the pair of openings being separated from one another by a pillar of the insulation material;
- forming a conductive material on the surface of the insulation material, along sidewalls of the pair of openings, and on the surface of the pillar, the conductive material leaving a cavity in each opening; and
- reducing the height of the pillar to be lower than the top of the sidewalls of the pair of openings.

3. The method of claim 2 wherein the step of forming a pair of openings includes:
- forming a first patterned photoresist over an insulation material such that openings in the photoresist align to a pair of underlying conductors; and
- etching into the insulation material to form a pair of openings separated by a pillar of insulation material, each one of the openings exposing one of the conductors.

4. The method of claim 3 further comprising:
- removing an upper horizontal component of the conductive material to expose an upper surface of the insulation material; and
- forming an etch stop layer that covers the insulation material but exposes the pair of openings and the pillar.

5. The method of claim 4 further comprising:
- filling the cavity in each opening with resist material;
- forming a second patterned photoresist that covers the etch stop and exposes the pillar and a majority of each cavity; and
- removing the resist material from each of the cavities.

6. The method of claim 5 further comprising:
- forming a capacitor dielectric lining the pair of electrically separated capacitor electrodes; and
- forming a capacitor electrode laying on the capacitor dielectric lining, the capacitor electrode being common to only the pair of electrically separated capacitor electrodes.

7. The method of claim 6 wherein the conductive material is a hemi-spherical grain silicon conductor.

8. The method of claim 2 further comprising:
- forming a capacitor dielectric lining the pair of electrically separated capacitor electrodes; and
- forming a capacitor electrode laying on the capacitor dielectric lining, the capacitor electrode being common to only the pair of electrically separated capacitor electrodes.

9. A method of forming a capacitor structure in a semiconductor device, the method comprising:
- forming a pair of openings in an insulation material such that each opening exposes an underlying conductor, the pair of openings being separated from one another by a pillar of the insulation material and having sidewalls on the pillar and insulation material;
- forming a conductive material on the surface of the insulation material, along sidewalls of the pair of openings, and on the surface of the pillar, the conductive material leaving a cavity in each opening; and
- reducing the height of the pillar such that the pillar and sidewalls on the pillar are lower than the sidewalls on the insulation material;
- forming a capacitor dielectric lining the pair of electrically separated capacitor electrodes; and
- forming a capacitor electrode laying on the capacitor dielectric lining, the capacitor electrode being common to only the pair of electrically separated capacitor electrodes.

* * * * *